US007791901B2

(12) United States Patent
Sailor et al.

(10) Patent No.: US 7,791,901 B2
(45) Date of Patent: Sep. 7, 2010

(54) STAND-OFF MOUNTING APPARATUS FOR DISCRETE ELECTRICAL COMPONENTS

(75) Inventors: Steven L. Sailor, Westfield, IN (US); Hugh R. Hunkeler, Kokomo, IN (US); Lee R. Hinze, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 469 days.

(21) Appl. No.: 11/805,603

(22) Filed: May 24, 2007

(65) Prior Publication Data

US 2008/0291653 A1 Nov. 27, 2008

(51) Int. Cl.
*H05K 7/02* (2006.01)
*H05K 7/04* (2006.01)

(52) U.S. Cl. ...................................... 361/807; 361/810

(58) Field of Classification Search ......... 361/807–810, 361/803; 174/138 E, 138 D
See application file for complete search history.

(56) References Cited

U.S. PATENT DOCUMENTS

| | | | | |
|---|---|---|---|---|
| 4,219,172 | A * | 8/1980 | Murayama | 248/27.3 |
| 4,953,061 | A * | 8/1990 | Nitkiewicz | 361/807 |
| 5,426,265 | A * | 6/1995 | Savage, Jr. | 174/138 G |
| 5,699,235 | A * | 12/1997 | Tsurumiya et al. | 361/803 |
| 5,761,050 | A * | 6/1998 | Archer | 361/791 |
| 5,823,793 | A | 10/1998 | Bernardini | |
| 6,031,730 | A * | 2/2000 | Kroske | 361/784 |
| 6,163,460 | A | 12/2000 | Baur et al. | |
| 6,680,546 | B1 * | 1/2004 | Penketh | 307/9.1 |
| 6,984,796 | B2 * | 1/2006 | Blossfeld | 200/284 |
| 7,089,657 | B1 * | 8/2006 | Masumoto | 29/741 |
| 7,210,969 | B1 * | 5/2007 | Hashimoto | 439/751 |

FOREIGN PATENT DOCUMENTS

| | | |
|---|---|---|
| DE | 8903968 | 8/1990 |
| DE | 9203996 | 5/1992 |
| DE | 10107630 | 5/2002 |
| DE | 10337443 | 3/2005 |
| EP | 1615487 | 1/2006 |
| EP | 1737286 | 12/2006 |

OTHER PUBLICATIONS

EP Search Report dated Jun. 16, 2009.

* cited by examiner

*Primary Examiner*—Hung S Bui
(74) *Attorney, Agent, or Firm*—Thomas N. Twomey

(57) ABSTRACT

A stand-off mounting apparatus includes an insulative carrier for off-board mounting of leaded or surface-mount components, particularly large temperature-sensitive discrete components such as capacitors. The carrier has a component-mounting surface that is elevated relative to the circuit board, and is positioned with respect to the circuit board such that the circuit board area under the mounting surface of the carrier is available for the placement of smaller non-temperature-sensitive components. The off-board components are mounted on the component-mounting surface of the carrier, and the carrier may include support features for providing additional mechanical support for the components. Electrical leads for electrically coupling the elevated components to the circuit board may be insert-molded in the carrier, or may be inserted into plated through-holes in the carrier.

8 Claims, 3 Drawing Sheets

STAND-OFF MOUNTING APPARATUS FOR DISCRETE ELECTRICAL COMPONENTS

TECHNICAL FIELD

The present invention relates to the placement of discrete electronic components on a printed circuit board, and more particularly to a stand-off mounting apparatus for mounting large leaded or surface-mount components off the surface of a printed circuit board.

BACKGROUND OF THE INVENTION

In the manufacture of printed circuit boards that include large discrete components such as capacitors, it is desirable to mount such components in a way that consumes as little circuit board area as possible. For example, the U.S. Pat. No. 6,163,460 to Baur et al. shows several different arrangements for supporting a leaded capacitor off the surface of a circuit board and electrically coupling the capacitor to the circuit board with mounting shanks that press into plated through-holes formed in the circuit board. Moving such components off the surface of the circuit board frees-up circuit board surface area for accommodating smaller leaded and surface-mount devices. However, it is essential for durability that the off-board components be adequately supported to withstand vibration and other fatigue-related phenomena.

The increasing usage of lead-free soldering processes has caused an additional problem with capacitors and other temperature-sensitive components due to the higher melting temperature of most lead-free solders. Accordingly, there is a need to isolate such temperature-sensitive components during the soldering process.

SUMMARY OF THE INVENTION

The present invention is directed to an improved stand-off mounting apparatus including an insulative carrier for off-board mounting of leaded or surface-mount components, particularly large temperature-sensitive discrete components such as capacitors. The carrier has a component-mounting surface that is elevated relative to the circuit board on insulative legs or metal pins such that the circuit board area under the mounting surface of the carrier is available for the placement of small non-temperature-sensitive components. The off-board components are mounted on the component-mounting surface of the carrier, and the carrier may include support features for providing additional mechanical support for the components. The off-board components are electrically coupled to the circuit board by the metal pins or by electrical leads insert-molded in the legs of the carrier.

DESCRIPTION OF THE PREFERRED EMBODIMENT

Figure 1A:
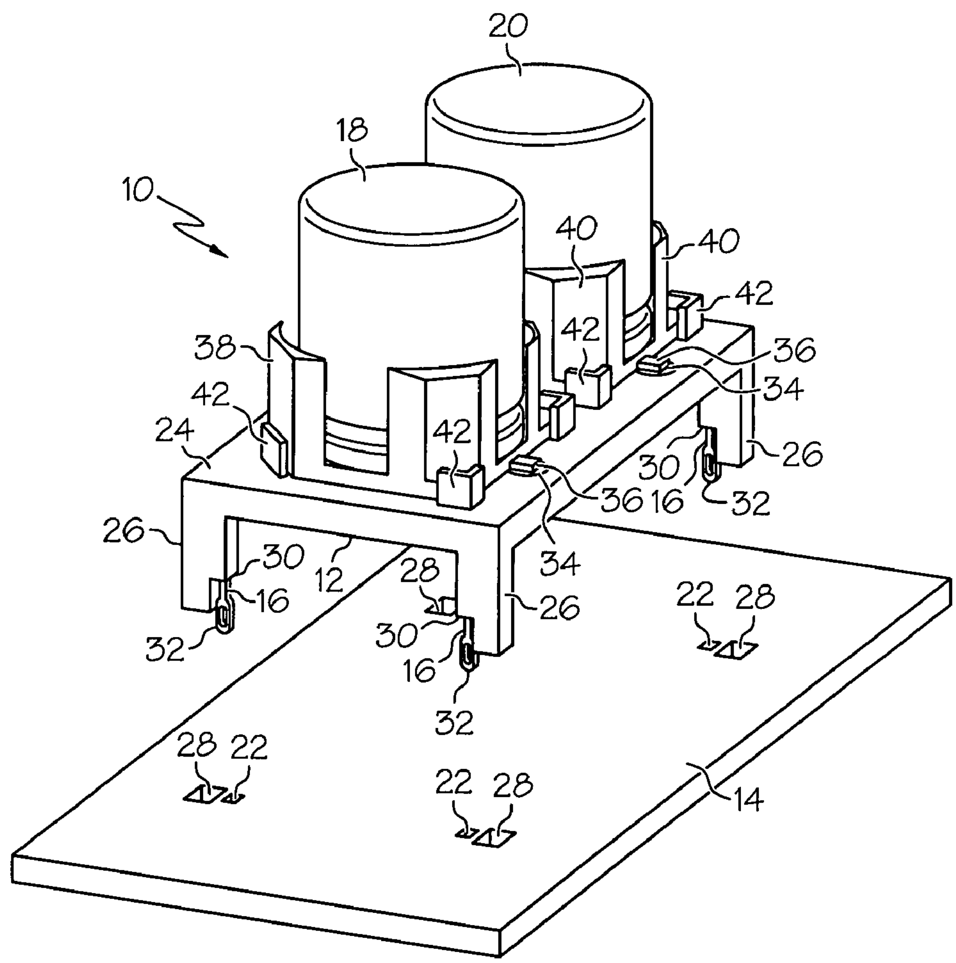
FIG. 1A is an exploded isometric view of a stand-off component mounting apparatus and circuit board according to a first embodiment of this invention.
Figure 1B:
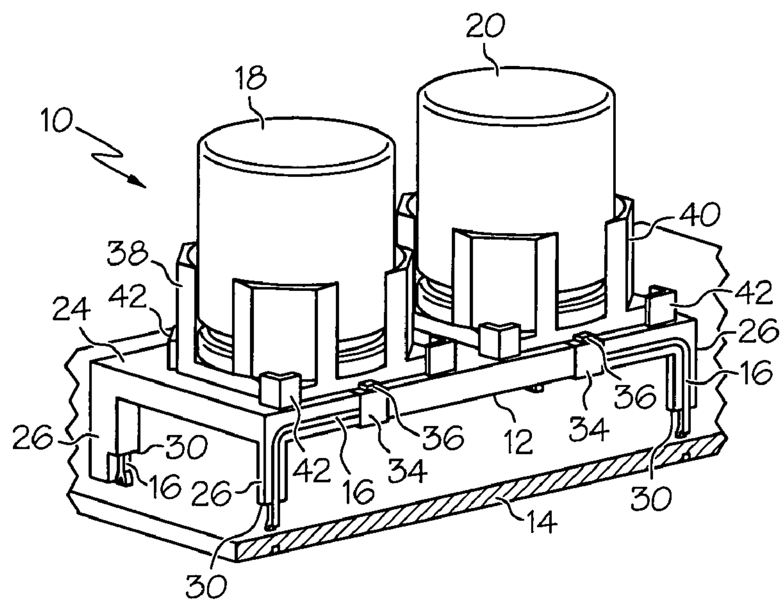
FIG. 1B is an isometric view of the embodiment of FIG. 1A, partially assembled and partially cross-sectioned to show insert molded electrical interconnect leads.
Figure 2A:
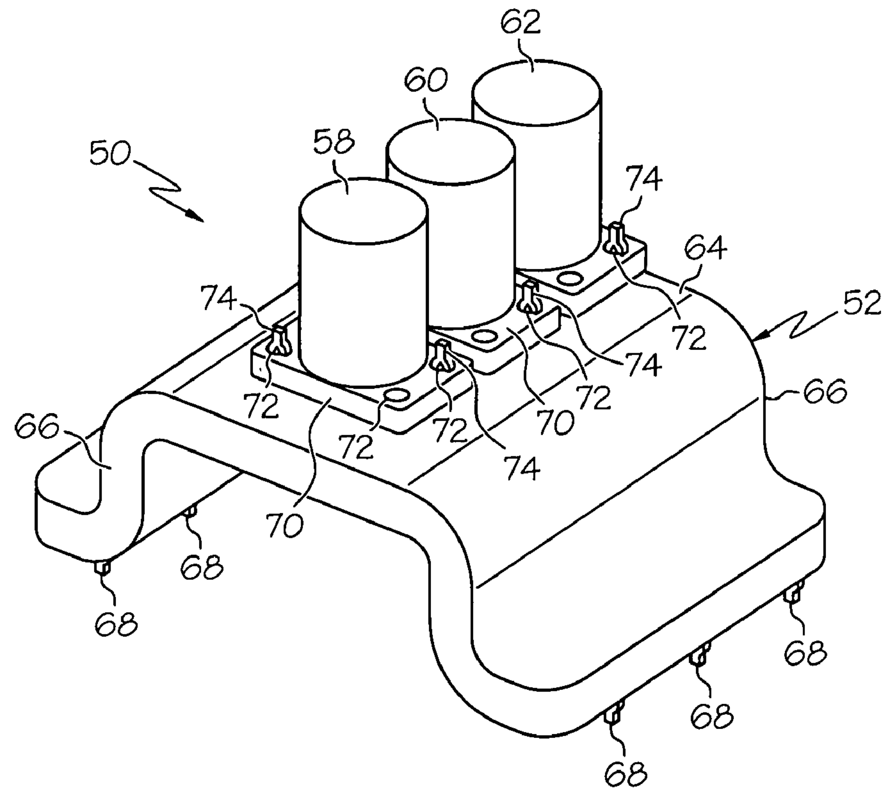
FIG. 2A is an isometric view of a stand-off component mounting apparatus according to a second embodiment of this invention.
Figure 2B:
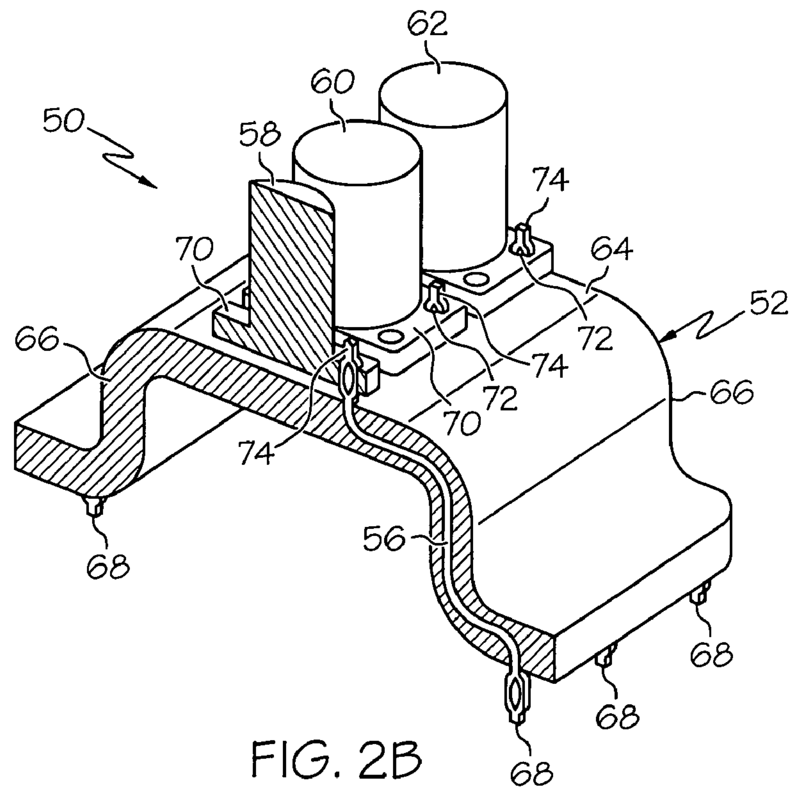
FIG. 2B is an isometric view of the embodiment of FIG. 2A, partially cross-sectioned to show insert molded electrical interconnect leads.
Figure 3A:
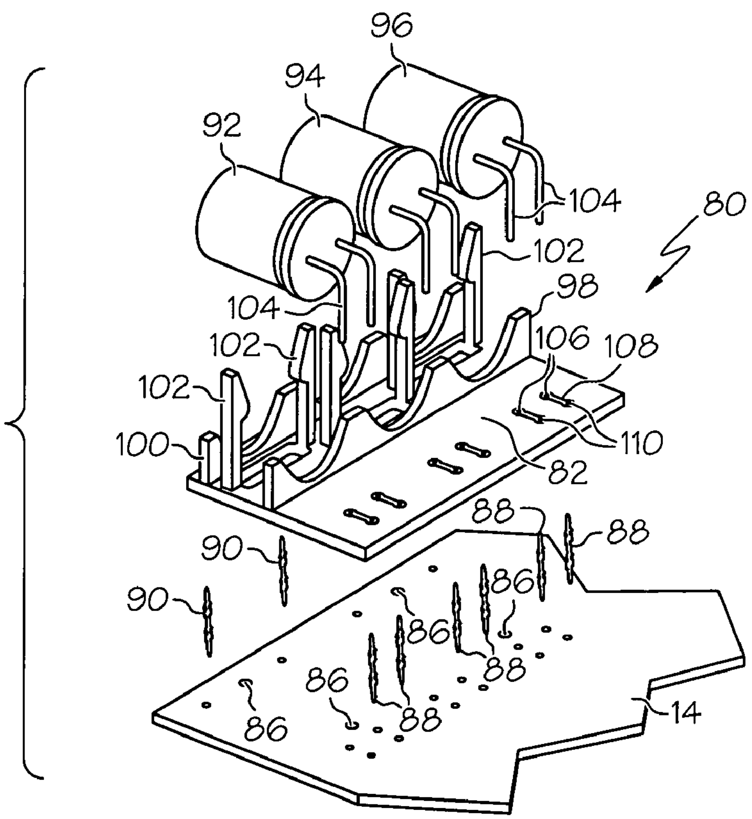
FIG. 3A is an exploded isometric view of a stand-off component mounting apparatus and circuit board according to a third embodiment of this invention.
Figure 3B:
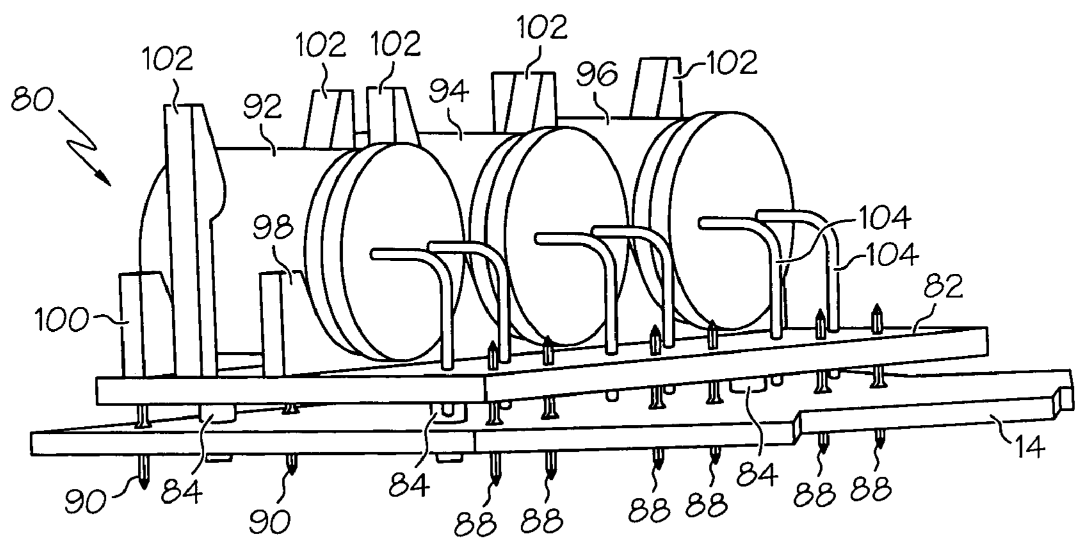
FIG. 3B is an isometric view of the embodiment of FIG. 3A as fully assembled.

In general, the present invention is directed to a stand-off mounting apparatus that includes an insulative carrier or frame for off-board mounting of large leaded or surface-mount components such as capacitors. The mounting apparatus is particularly advantageous for components that are incompatible with high temperature lead-free soldering processes, as the carrier may be mounted on the circuit board following completion of the soldering process for the on-board components. The carrier has a component-mounting surface or platform that is elevated relative to the circuit board such that the circuit board area under the platform of the carrier is available for the placement of small on-board components. FIGS. 1A-1B and 2A-2B depict embodiments in which the component-mounting surface is positioned with respect to the circuit board by insulative legs that mechanically engage the circuit board. FIGS. 3A-3B depict an embodiment in which the component-mounting surface is positioned with respect to the circuit board by metal pins that also electrically couple the off-board components to the circuit board. The embodiment of FIGS. 1A-1B is particularly suited to surface-mount components and features insert-molded electrical interconnects with compliant terminals for solder-free attachment of the carrier to the circuit board. The embodiment of FIGS. 2A-2B is conceptually similar to that of FIGS. 1A-1B, except that the components include an insulative base with plated through-holes instead of leads. And the embodiment of FIGS. 3A-3B is particularly suited to leaded components, with the carrier including component support features.

Referring to FIGS. 1A-1B, the reference numeral 10 generally designates a stand-off mounting apparatus according to the first embodiment of this invention. The apparatus 10 includes a molded plastic carrier or frame 12 that is mechanically coupled to a printed circuit board 14, and a set of four insert-molded conductive leads 16 for electrically coupling a pair of two-terminal surface mount components 18 and 20 to plated through-holes 22 formed in the circuit board 14. The apparatus 10 could be extended, of course, to accommodate one or more additional off-board components if desired, by providing additional pairs of conductive leads 16.

The carrier 12 includes a planar platform 24 and a set of four integral legs 26 that extend perpendicularly downward from the platform 24. The legs 26 are undercut at their ends for insertion into a set of complementary openings 28 formed in circuit board 14 adjacent the plated through-holes 22. If desired, the ends of legs 26 may be provided with hooks or other snap retention features that mechanically retain the carrier 12 on the circuit board 14 once they are fully inserted into the openings 28. Molding the legs 26 with an undercut as shown provides each leg with a shoulder 30 that engages the circuit board 14 in a region bounding the respective plated-through-hole 22 to provide an insertion stop and to ensure level placement of the carrier 12 with respect to the circuit board 14.

The insert-molded conductive leads 16 pass through the platform 24 and each leg 26 of carrier 12 as shown in FIG. 1B. One end of each conductive lead 16 is in the form of a compliant terminal 32 that protrudes out of the shoulder 30 of the respective leg 26 for insertion into a respective plated through-hole 22 as the leg 26 is inserted into the respective circuit board opening 28. The other end of each conductive lead 16 is in the form of a lug 34 having upper and lower surfaces that are substantially flush with the upper and lower surfaces of platform 24. The upper surface of each lug 34 provides a bond pad for soldering the respective insert-molded lead 16 to a surface-mount terminal 36 component of component 18 or 20, and the lower surface of each lug 34 provides a location for bottom-side heating of the lug 34 (if desired) when the component terminal 36 is soldered to the upper surface of the lug 34.

The components 18, 20 are physically retained on the platform 24 by virtue of the solder joints (or other bond) between the component terminals 36 and the insert-molded lugs 34. Additional mechanical support is provided by insulative jackets 38 and 40 that cover the ends of the components 18 and 20. The jackets 38 and 40 may be glued to the upper face of platform 24, and laterally nest within a set of wall segments 42 formed on the upper face of platform 24. The interface between the jackets 38 and 40 and the respective wall segments 42 of platform 24 provides lateral stability to the jackets 38 and 40 (and therefore, the components 18 and 20) and properly orients the component terminals 36 with respect to the insert-molded lugs 34.

Since the platform 24 is elevated with respect to the circuit board 14, the circuit board area under platform 24 is available for placement of smaller leaded or surface-mount components to improve surface area utilization of circuit board 14. If a high-temperature lead-free solder process is used to electrically join the on-board components to the circuit board 14, the mounting apparatus 10 may be installed on circuit board 14 following completion of the high-temperature soldering process. A low-temperature solder process (or other bonding process) may be used to electrically join the component terminals 36 to the insert-molded lugs 34 of apparatus 10, and the electrical junctions between compliant terminals 32 and the plated through-holes 22 of circuit board 14 are solder-free by design. Accordingly, neither the component terminals 36 nor the insert-molded leads 16 are exposed to high-temperature solder processes.

Referring to FIGS. 2A-2B, the reference numeral 50 generally designates a stand-off mounting apparatus according the second embodiment of this invention. The apparatus 50 also includes a molded plastic carrier or frame 52 that is mechanically coupled to a printed circuit board (not shown), and a set of insert-molded conductive leads 56 for electrically coupling a set of discrete components to plated through-holes (not shown) formed in the circuit board. As illustrated, the apparatus 50 is configured to accommodate a set of three two-terminal components 58, 60, 62, and therefore includes a set of six insert-molded conductive leads 56; however, it will be appreciated that the design could be extended to accommodate one or more additional off-board components.

The carrier 52 includes a planar platform 64 for supporting the components 58-62, but differs from the carrier 12 in a few respects. The legs 66 extending from the platform 64 of carrier 52 each extend the entire length (or width) of the platform 64. The principle difference is that the carrier 52 is configured to receive components 58-62 that are provided with an insulative base 70 with plated through-holes 72 that internally connect to the component instead of leads or surface-mount terminals. Accordingly, the insert-molded conductor leads 56 terminate not in flush lugs, but compliant terminals 74 that protrude upward out of the platform 64 as best seen in FIG. 2B. The other end of each insert-molded conductor lead 56 terminates in a downwardly projecting compliant terminal 68 similar to the apparatus 10 of FIGS. 1A-1B. The carrier 52 is mounted on the circuit board 14 in a manner similar to that of carrier 12, and the components 58-62 are individually mounted (by hand or machine) on the platform 64 such that the compliant terminals 74 are pressed into the respective plated through-holes 72 as shown. The components 58-62 may be glued to the upper face of platform 64 to provide additional rigidity.

Referring to FIGS. 3A-3B, the reference numeral 80 generally designates a stand-off mounting apparatus according the third embodiment of this invention. In this embodiment, carrier 82 is supported with respect to circuit board 14 by a set of metal pins 88 with double-ended compliant terminals that press into vertically aligned through-holes formed in circuit board 14 and carrier 82. Each of the pins 88 has a pair of shoulder stops intermediate the compliant terminals that engage the facing surfaces of circuit board 14 and carrier 82 to determine the separation distance between circuit board 14 and carrier 82. The metal pins 88 also function to electrically couple the leaded components 92, 94, 96 to the circuit board 14 as explained below. An additional set of pins 90 (dummy pins) support peripheral regions of carrier 82 with respect to circuit board 14, but serve no electrical function. Pins 90 may include compliant terminals like the pins 88, or some other type of terminal that is secured to circuit board 14 and carrier 82 by heat staking or adhesive, for example. Optionally, the carrier 82 may be provided with one or more depending legs 84 to provide additional support between circuit board 14 and carrier 82, and mechanical retention of the carrier 82 on circuit board 14.

The carrier 82 also differs from carriers 12 and 52 in that its upper face is provided with integral cradle and snap retention features 98, 100, 102 for mechanically retaining the leaded components 92, 94 and 96. The leads 104 of components 92-96 are bent downward as shown, and extend into a set of plated through-holes 106 in carrier 82, to which they are electrically joined using conductive adhesive or a localized heat (laser, for example) soldering process. A set of conductor traces 108 on carrier 82 electrically couple the through-holes 106 with a second set of plated through-holes 110 disposed laterally outboard of the through-holes 106, and the compliant terminal pins 88 extend into the through-holes 110. Alternately, a set of insert-molded interconnects can be used in place of the plated through-holes 106 and conductor traces 108.

In summary, the stand-off mounting apparatus of the present invention provides a reliable and cost-effective way of achieving off-board mounting of leaded or surface-mount components for the purposes of improving circuit board surface area utilization and accommodating components that are not compatible with high-temperature solder processes used to join on-board components to the circuit board. While the invention has been described with respect to the illustrated embodiment, it is recognized that numerous modifications and variations in addition to those mentioned herein will occur to those skilled in the art. For example, compatible features disclosed with respect to one embodiment may be incorporated into a different embodiment, and so on. Accordingly, it is intended that the invention not be limited to the disclosed embodiment, but that it have the full scope permitted by the language of the following claims.

The invention claimed is:

1. Stand-off mounting apparatus for supporting at least one discrete electrical component and electrically coupling said component to a circuit board, comprising:

an insulative carrier including a platform on which the discrete electrical component is mounted and insulative legs that depend from said platform and mechanically engage said circuit board to support said platform with respect to said circuit board, said platform being elevated off the circuit board, said insulative carrier being formed of a molded plastic body; and electrical interconnect leads insert molded into the molded plastic body and extending between the insulative carrier and the circuit board for electrically coupling the discrete electrical component to the circuit board.

2. The stand-off mounting apparatus of claim 1, where:

the electrical interconnect leads are provided with compliant terminals that press into plated through-holes in the circuit board to effect solderless electrical couplings between the interconnect leads and the circuit board.

3. The stand-off mounting apparatus of claim 1, where:

the electrical interconnect leads terminate in insert-molded lugs that have exposed surfaces on the platform of the insulative carrier; and the discrete electrical component includes surface-mount terminals that engage the exposed surfaces of the insert-molded lugs to electrically couple the electrical interconnect leads to the surface-mount terminals of the discrete electrical component.

4. The stand-off mounting apparatus of claim 3, where:

the surface-mount terminals of the discrete electrical component are soldered to the exposed surfaces of the insert-molded lugs; and the insert molded lugs have additional exposed surfaces for applying heat to junctions between the surface-mount terminals of the discrete electrical component and the insert-molded lugs.

5. The stand-off mounting apparatus of claim 1, where:

the discrete electrical component includes a mounting block with plated through-hole terminals; and the insert-molded interconnect leads are provided with compliant terminations that extend out of said platform and press into the plated through-hole terminals of said discrete electrical component to effect solderless electrical couplings between the interconnect leads and the discrete electrical component.

6. The stand-off mounting apparatus of claim 5, where:

the mounting block of the discrete electrical component is secured to the platform of said insulative carrier.

7. The stand-off mounting apparatus of claim 1, where:

the platform of the insulative carrier includes component retaining features for mechanically securing the discrete electrical component to the insulative carrier.

8. Stand-off mounting apparatus for supporting at least one discrete electrical component and electrically coupling said component to a circuit board, comprising:

a component jacket mechanically joined to the discrete electrical component;

an insulative carrier including a platform on which the discrete electrical component is mounted and insulative legs that depend from said platform and mechanically engage said circuit board to support said platform with respect to said circuit board, the component jacket being nested within a set of wall segments that extend out of the platform for properly orienting said discrete electrical component on said platform, said platform being elevated off the circuit board, said insulative carrier being formed of a molded plastic body; and electrical interconnect leads insert molded into the molded plastic body and extending between the insulative carrier and the circuit board for electrically coupling the discrete electrical component to the circuit board.

* * * * *